(12) United States Patent
Baek et al.

(10) Patent No.: US 7,652,383 B2
(45) Date of Patent: Jan. 26, 2010

(54) SEMICONDUCTOR PACKAGE MODULE WITHOUT A SOLDER BALL AND METHOD OF MANUFACTURING THE SEMICONDUCTOR PACKAGE MODULE

(75) Inventors: Seung-Duk Baek, Gyeonggi-do (KR); Sun-Won Kang, Seoul (KR); Dong-Ho Lee, Gyeonggi-do (KR); Jong-Joo Lee, Gyeonggi-do (KR); Sang-Wook Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 404 days.

(21) Appl. No.: 11/305,282

(22) Filed: Dec. 16, 2005

(65) Prior Publication Data
US 2006/0138648 A1 Jun. 29, 2006

(30) Foreign Application Priority Data
Dec. 28, 2004 (KR) .................. 10-2004-0113688

(51) Int. Cl.
*H01L 23/29* (2006.01)

(52) U.S. Cl. ............ 257/787; 257/777; 257/780; 257/781; 257/783; 257/784; 257/773; 257/776; 257/E23.02; 257/E23.033; 257/E23.068

(58) Field of Classification Search ............ 257/48, 257/790
See application file for complete search history.

(56) References Cited

U.S. PATENT DOCUMENTS

| | | | | |
|---|---|---|---|---|
| 5,729,050 A * | 3/1998 | Kim | ............... | 257/667 |
| 6,312,962 B1 | 11/2001 | Munch et al. | | |
| 6,661,104 B2 * | 12/2003 | Jiang et al. | ............... | 257/789 |
| 6,747,361 B2 * | 6/2004 | Ichinose | ............... | 257/784 |
| 7,009,288 B2 * | 3/2006 | Bauer et al. | ............... | 257/690 |
| 7,163,842 B2 * | 1/2007 | Karnezos | ............... | 438/108 |
| 2004/0113253 A1 | 6/2004 | Karnezos | | |

FOREIGN PATENT DOCUMENTS

| | | |
|---|---|---|
| JP | 09-307024 | 11/1997 |
| KR | 2002-0074997 | 10/2002 |

OTHER PUBLICATIONS

English language abstract of Korean Publication 2002-0074997.
English language abstract of Japanese Publication 09-307024.

* cited by examiner

*Primary Examiner*—Jasmine J Clark
(74) *Attorney, Agent, or Firm*—Volentine & Whitt, PLLC (57) ABSTRACT

A semiconductor package module having no solder balls and a method of manufacturing the semiconductor package module are provided. The semiconductor package module includes a module board on which a plurality of semiconductor devices are able to be mounted, a semiconductor package bonded on the module board using an adhesive, being wire-bondable to the module board, and having already undergone an electrical final test, second wires electrically connecting second bond pads of the semiconductor package to bond pads of the module board; and a third sealing resin enclosing the second wires and the semiconductor package. Because the semiconductor package module does not use solder balls, degradation of solder joint reliability (SJR) can be prevented. Further, the use of a semiconductor package that has already undergone an electrical test can reduce degradation of the yield of a completed semiconductor package module.

8 Claims, 10 Drawing Sheets

SEMICONDUCTOR PACKAGE MODULE WITHOUT A SOLDER BALL AND METHOD OF MANUFACTURING THE SEMICONDUCTOR PACKAGE MODULE

CROSS-REFERENCES TO RELATED APPLICATIONS

This application claims the benefit of Korean Patent Application No. 10-2004-0113688, filed on Dec. 28, 2004, in the Korean Intellectual Property Office, the disclosure of which is incorporated herein in its entirety by reference.

BACKGROUND OF THE INVENTION

1. Field of the Invention

The present invention relates to a semiconductor package module and a method of manufacturing the same, and more particularly, to a semiconductor package module having a package module without solder balls and a method of manufacturing the semiconductor package module.

2. Description of the Prior Art

Standard semiconductor package modules are area adapted to perform a specific function and include several semiconductor components or devices mounted to a single printed circuit board (PCB), also called a module board. To save on costs, modules are typically assembled using standardized parts such as memory chips and the like. After such a modularized semiconductor package module is completely assembled, the module is subject to an electrical test to check the functionality of the module. If a component mounted on a module board in such a semiconductor package module is a memory device, such as a DRAM or an SRAM, the semiconductor package module is referred to as a semiconductor memory module.

Figure 1A:
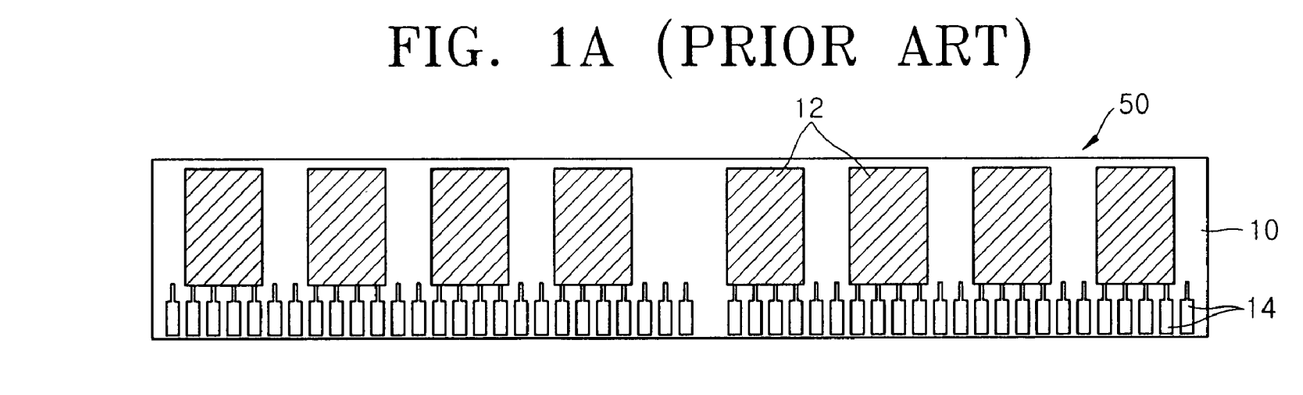
FIGS. 1A and 1B are a plan view and a cross-sectional view, respectively, of a general semiconductor package module.
Figure 1B:
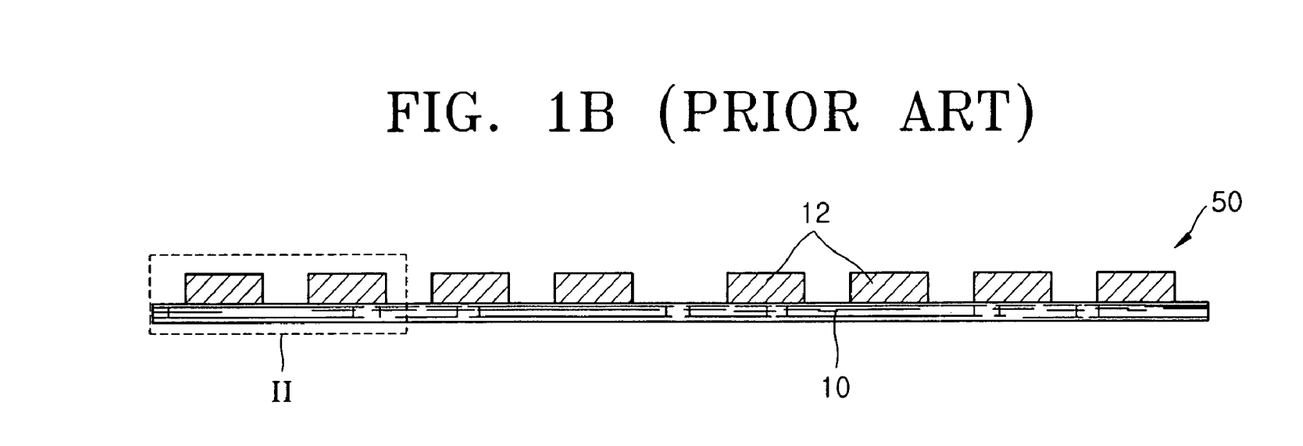

FIGS. 1A and 1B are a plan view and a cross-sectional view, respectively, of a general semiconductor package module 50.

The general semiconductor package module 50, which is a multi-layered substrate, is manufactured by mounting a plurality of semiconductor devices, for example, semiconductor packages 12, on a module board 10 in which a printed circuit pattern is formed. Connecting pads 14 for connecting a function of the semiconductor package module 50 to a mother board (not shown) are formed on one side of the module board 10.

Figure 2:
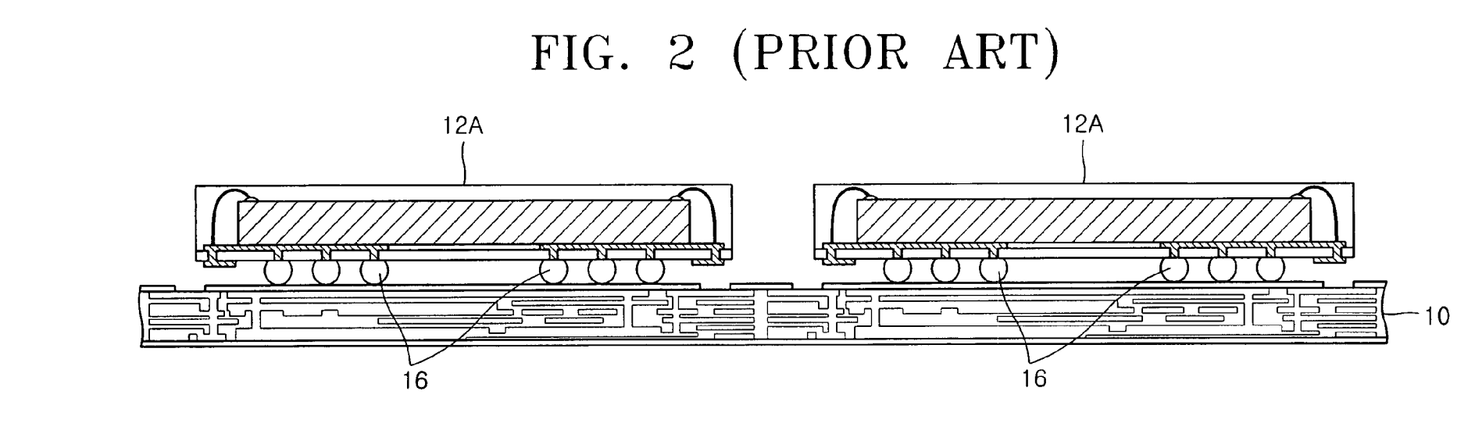
FIG. 2 is a cross-sectional view of portion II of the semiconductor package module of FIG. 1 showing solder balls attached to semiconductor packages.

FIG. 2 is a cross-sectional view illustrating solder balls attached to semiconductor packages of the semiconductor package module of FIG. 1. More specifically, the cross-sectional view of FIG. 2 corresponds to a portion II of FIG. 1. Referring to FIG. 2, a semiconductor package 12A has a shape of a ball grid array (BGA) and is connected to the module board 10 via solder balls 16 attached to a lower surface of the semiconductor package 12A.

A known problem with using solder balls as a connection structure between devices is the solder joint reliability (SJR) problem in which adhesion of the solder balls 16 to the module board 10 is weakened due to a difference between thermal expansion coefficients of the module board 10, which includes an insulative layer and a copper printed circuit pattern, and the semiconductor packages 12A. Further, the quality of the semiconductor device may degrade after performing a high-temperature reflow process to attach the solder balls 16 of the semiconductor packages 12A to the module board 10. Other attachment structures have been proposed to overcome this problem.

Figure 3:
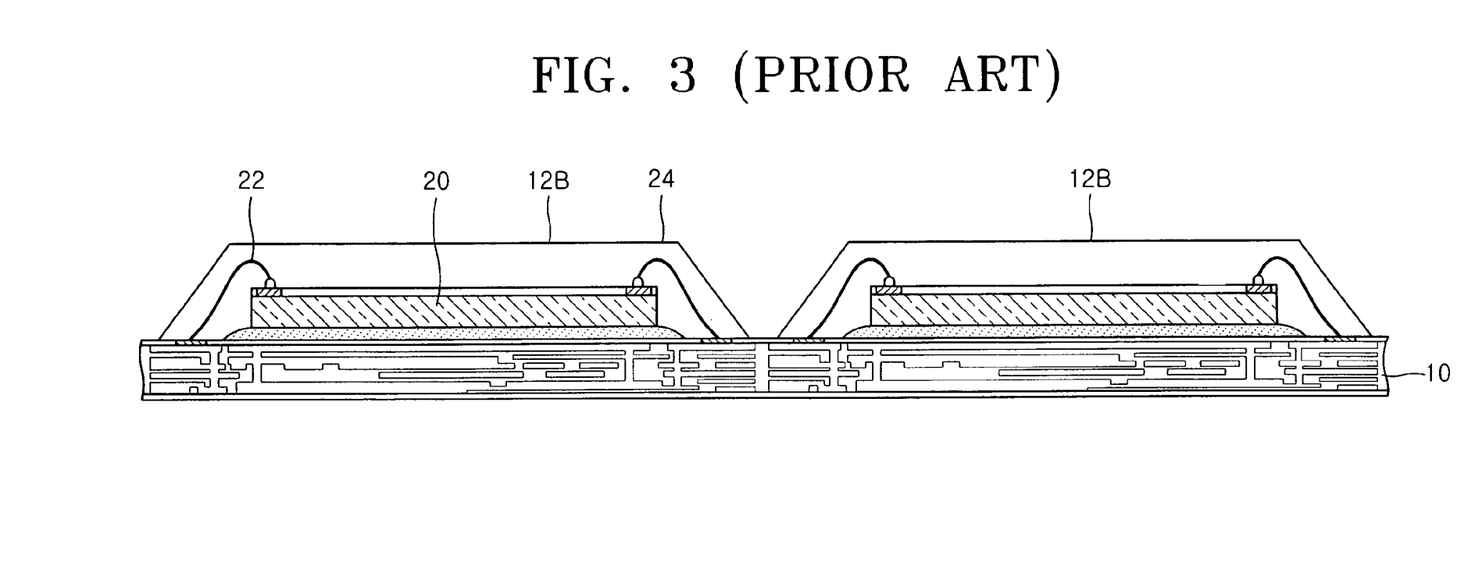
FIG. 3 is a cross-section of the semiconductor package module of FIG. 1 when the semiconductor packages have chip on board (COB) structures.

FIG. 3 illustrates an alternate electrical connection technique to the ball-grid array, showing a cross-section of the semiconductor package module of FIG. 1 when a semiconductor package has a chip on board (COB) structure such as disclosed in U.S. Pat. No. 6,312,962, patented on Nov. 6, 2001, entitled "Method for COB Mounting of Electronic Chips on a Circuit Board." Referring to FIG. 3, a semiconductor package 12B includes a semiconductor chip 20 directly attached to the module board 10 using an adhesive element. Package 12B has a pad directly connected to a contact pad of the module board 10 via a wire 22, and is enclosed by a covering compound. However, because the semiconductor chip 20 mounted on the module board 10 is still bare, a semiconductor package module having such a COB structure is highly likely to be found out defective after being completely assembled.

To avoid this problem, a known good die, that is, a semiconductor chip whose function has been completely electrically tested, must be used. However, there are still many difficulties in developing such a known good die.

Accordingly, the need remains for alternate methods for forming packaging modules that overcome the drawbacks inherent in other methods of the semiconductor arts.

SUMMARY OF THE INVENTION

The present invention provides a semiconductor package module and method for manufacturing thereof that is intended to overcome issues with degradation of solder joint reliability (SJR) by using bonding to the module board a semiconductor package, whose function has been completely inspected, without the use of solder balls.

According to an aspect of the present invention, there is provided a semiconductor package module comprising: a module board on which a plurality of semiconductor devices are able to be mounted; a semiconductor package bonded on the module board using an adhesive, being wire-bondable to the module board, and having already undergone an electrical final test; second wires electrically connecting second bond pads of the semiconductor package to bond pads of the module board; and a third sealing resin sealing the second wires and the semiconductor package.

The semiconductor package may have a structure in which solder ball pads are exposed to undergo an electrical performance test and second bond pads are exposed to be wire-bonded to the module board.

The semiconductor package may comprise, in an embodiment: a substrate having first bond pads formed on one surface of the substrate, solder ball pads formed on the surface of the substrate and connected to the first bond pads, second bond pads formed on the surface of the substrate and connected to the solder ball pads, and a slit for wire bonding formed in the center of the substrate; a semiconductor chip bonded to the substrate using an adhesive so that a circuit surface of the semiconductor chip can contact the substrate, the semiconductor chip having a bond pad formed in the center of the semiconductor chip; first wires connecting the bond pad of the semiconductor chip to the first bond pads of the substrate through the slit of the substrate; a first sealing resin sealing lateral sides of the semiconductor chip on the substrate; and a second sealing resin sealing the first wires exposed through the slit of the substrate and a part of the substrate.

The semiconductor package may comprise, in another embodiment: a substrate having first bond pads formed on one surface of the substrate, second bond pads connected to the first bond pads and formed on a surface of the substrate opposite to the surface on which the first bond pads are formed, and solder ball pads connected to the second bond pads and formed on the surface of the substrate where the second bond pads are formed; a semiconductor chip bonded to the substrate using an adhesive so that a circuit surface of the semiconductor chip can be opposite to the surface of the substrate on which the first bond pads are formed, the semiconductor chip having bond pads formed on the edges of the semiconductor chip; first wires connecting the bond pads of the semiconductor chip to the first bond pads of the substrate; and a first sealing resin enclosing the semiconductor chip on the substrate, the first wires, and the first bond pads.

The semiconductor package may comprise, in yet another embodiment: a substrate having first bond pads formed on one surface of the substrate, second bond pads connected to the first bond pads and formed on the surface of the substrate on which the first bond pads are formed, and solder ball pads connected to the first and second bond pads and formed on a surface of the substrate opposite to the surface where the first and second bond pads are formed; a semiconductor chip bonded to the substrate using an adhesive so that a circuit surface of the semiconductor chip can be opposite to the surface of the substrate on which the first and second bond pads are formed, the semiconductor chip having bond pads formed on the edges of the semiconductor chip; first wires connecting the bond pads of the semiconductor chip to the first bond pads of the substrate; and a first sealing resin sealing the semiconductor chip on the substrate, the first wires, and the first bond pads and simultaneously exposing the second bond pads.

According to another aspect of the present invention, there is provided a method of manufacturing a semiconductor package module, the method comprising: preparing for a module board; bonding a semiconductor package having a specific structure to the module board, the semiconductor package including solder ball pads exposed to undergo an electrical final test and second bond pads exposed to be wire bonded to the module board; connecting the second bond pads of the semiconductor package to a bond pad of the module board using second wires; and sealing the semiconductor package and the second wires using a third sealing resin.

The module board may include a passive device mounted on the module board. The semiconductor package may be bonded to the module board using an adhesive at 200° C. or less.

In sealing the semiconductor package and the second wires using the third sealing resin, only areas where the second wires are formed may be sealed, or the entire area of the semiconductor package and the areas where the second wires are formed may be sealed.

As described above, a semiconductor package module according to the present invention does not use solder balls, thus preventing degradation of solder joint reliability (SJR). Further, the use of a semiconductor package that has already passed an electrical test can prevent degradation of the yield of a completed semiconductor package module.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 4:
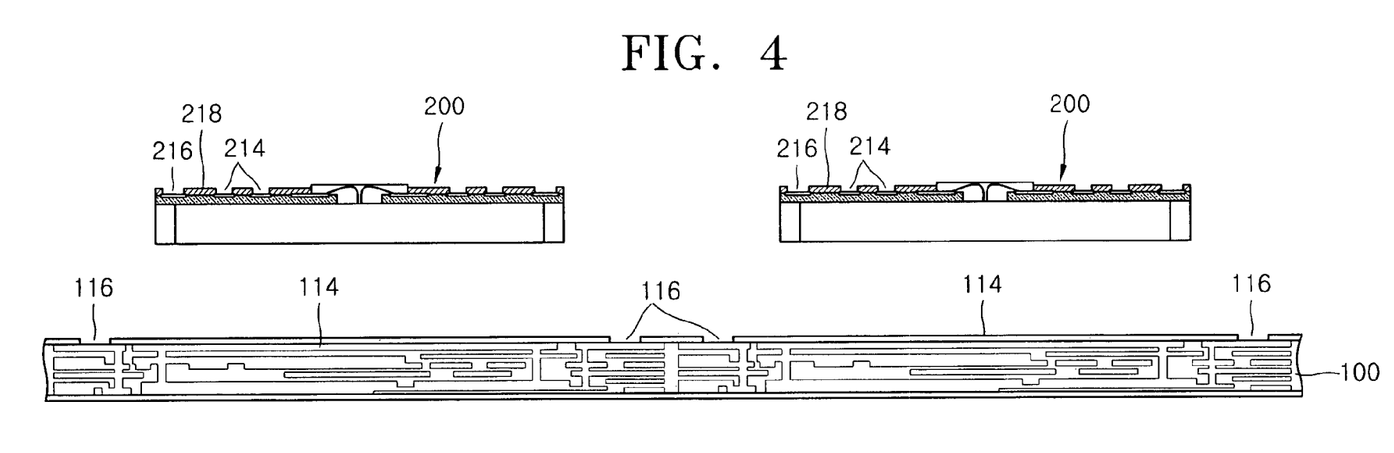
FIGS. 4 through 9 are views for illustrating a semiconductor package module according to an embodiment of the present invention.

FIGS. 4 through 9 are views for illustrating a semiconductor package module according to an embodiment of the present invention. FIG. 4 shows a module in side cross-section but exploded view. The semiconductor package module includes a module board 100 on which a plurality of semiconductor devices can be mounted. The module board 100, which is a multi-layered print circuit board, includes bond pads 116 for wire bonding, and spaces 114 on which semiconductor packages 200 can be mounted. The bond pads 116 and the spaces 114 are formed on an upper surface of the module board 100.

Figure 7:
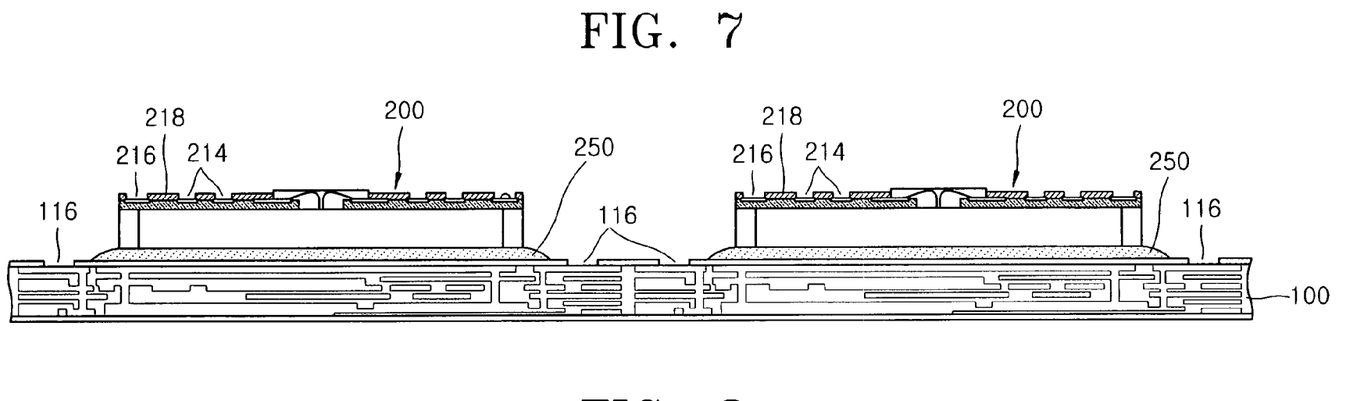
Figure 8:
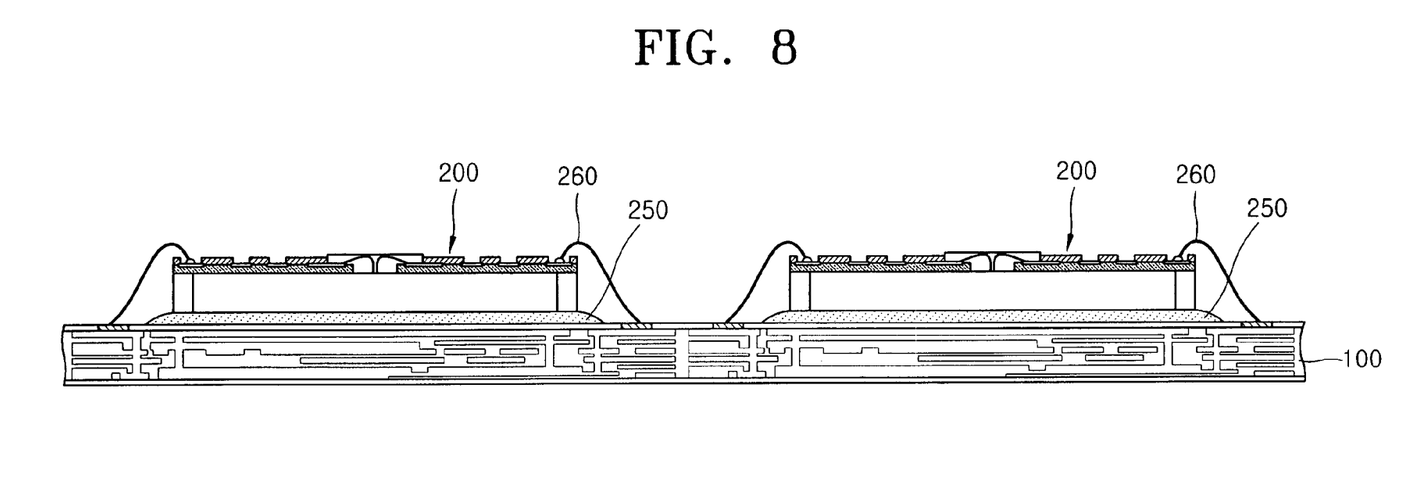

The semiconductor package module further includes a semiconductor package 200, which is mounted on an adhesive 250 (FIG. 7) installed on the module board 100 and has a structure that can be wire-bonded to the module board 100 as shown in FIG. 8. It is preferred that the semiconductor package 200 has completely undergone an electrical final test.

Figure 9:
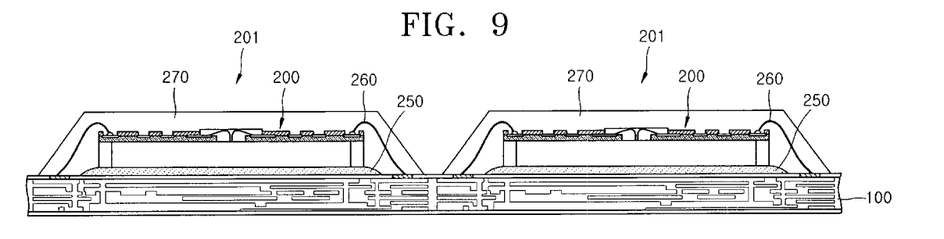

The semiconductor package module further includes a second wire 260, which electrically connects a second bond pad 216 of the semiconductor package 200 to the bond pad 116 of the module board 100 A third covering compound 270 encloses the second wire 260 and the semiconductor package 200 as shown in FIG. 9.

Figure 5:
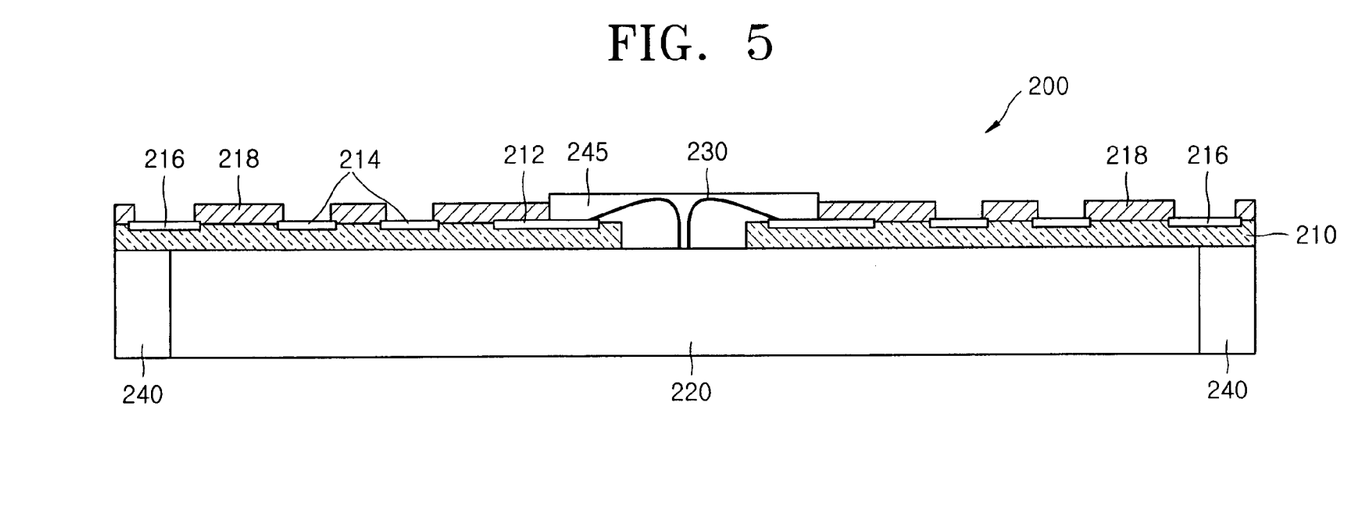
Figure 6:
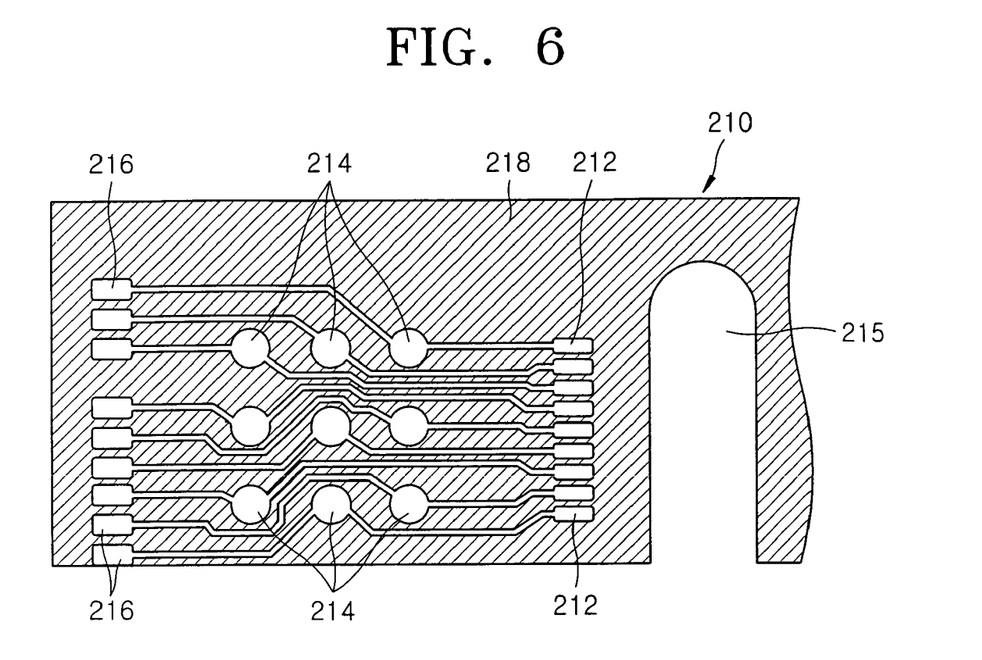

A structure of the semiconductor package 200 will now be described in greater detail with reference to FIGS. 5 and 6. The semiconductor package 200 is formed using a substrate 210. The substrate 210 includes first bond pads 212 formed on one surface, solder ball pads 214 formed on the surface where the first bond pads 212 are formed and connected to the first bond pads 212, and second bond pads 216 formed on the surface where the solder ball pads 214 are formed and connected to the solder ball pads 214. A wire bonding slit 215 is formed in the center of the substrate 210.

The locations of the solder ball pads 214 and the second bond pads 216 on the substrate 210 are determined according to an international standard established by Joint Electron Device Engineering Council (JEDEC). Hence, the locations of the solder ball pads 214 and the second bond pads 216 on the substrate 210 are consistent with locations of an existing BGA package having solder balls and a COB package which performs wire bonding. As a result, the semiconductor package module shown in FIGS. 4 through 9 can be applied without change in the design.

A semiconductor chip 220 is attached to a bottom surface of the substrate 210. A circuit surface of the semiconductor chip 220 on which a circuit portion is formed is attached to a bottom surface of the substrate 210 using an adhesive (not shown). The semiconductor chip 220 has a bond pad formed in the center.

A first wire 230 connects the bond pad formed in the center of the semiconductor chip 220 to a first bond pad 212 of the substrate 210 via the slit 215 of the substrate 210. Lateral sides of the semiconductor chip 220 that exist on the substrate 210 are enclosed by a first sealing resin 240. A bottom surface of the semiconductor chip 220 opposite to the circuit surface thereof is suitable to be exposed to the outside in order to achieve effective thermal emission after being enclosed by the first sealing resin 240.

The first wire 230 exposed through the slit of the substrate 210 and a portion of the substrate 210 around the first wire 230 are enclosed by a second sealing resin 245. Reference numeral 218 denotes an insulating material, such as solder resist, formed on the substrate 210.

Consequently, in the manufactured semiconductor package 200, the solder ball pads 214 for an electrical test and the second bond pads 216 for connecting the semiconductor package 200 to the module board 100 are exposed, and the bottom surface of the semiconductor chip 220 is also exposed to increase the thermal emission effect.

A method of manufacturing the semiconductor package module according to an embodiment of the present invention will now be described with reference to FIGS. 4 through 9.

First, the module board 100 is provided with a passive device, such as used in a general DRAM module, mounted thereon. Then, the semiconductor package 200 shown in FIG. 5 is provided, having been pretested with a completed electrical final test conducted through the exposed solder ball pads 214. Thereafter, as shown in FIG. 7, the semiconductor package 200 is attached to the module board 100 using the adhesive 250 at 200° C. or less. The adhesive 250 may be either an adhesive tape or a liquid adhesive, such as, epoxy. The semiconductor package 200 is attached to the module board 100 so that the substrate 210 can face upward and the semiconductor chip 220 under the substrate 210 can contact the upper surface of the module board 100.

Next, as shown in FIG. 8, the second wire 260 connects the second bond pads 216 of the semiconductor package 200 to the bond pads 116 of the module board 100 using a wire bonding operation. Finally, as shown in FIG. 9, the semiconductor package 200 and the second wire 260 are molded using the third sealing resin 270 to thereby complete a semiconductor package 201 having no solder balls.

In FIG. 9, the third sealing resin 270 encloses the second wire 260 and the entire area of the semiconductor package 200. However, the third sealing resin 270 may enclose the second wire 260 and only a portion of the semiconductor package 200 on which the second wires 260 are formed.

Figure 10:
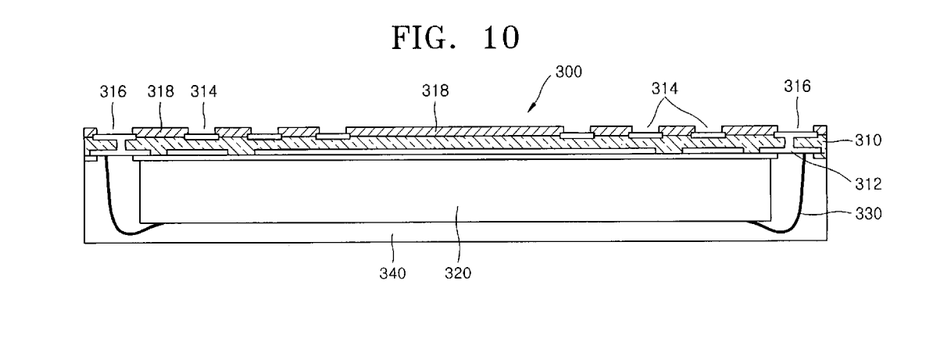
FIGS. 10 through 12 are views for illustrating a semiconductor package module according to another embodiment of the present invention.
Figure 11:
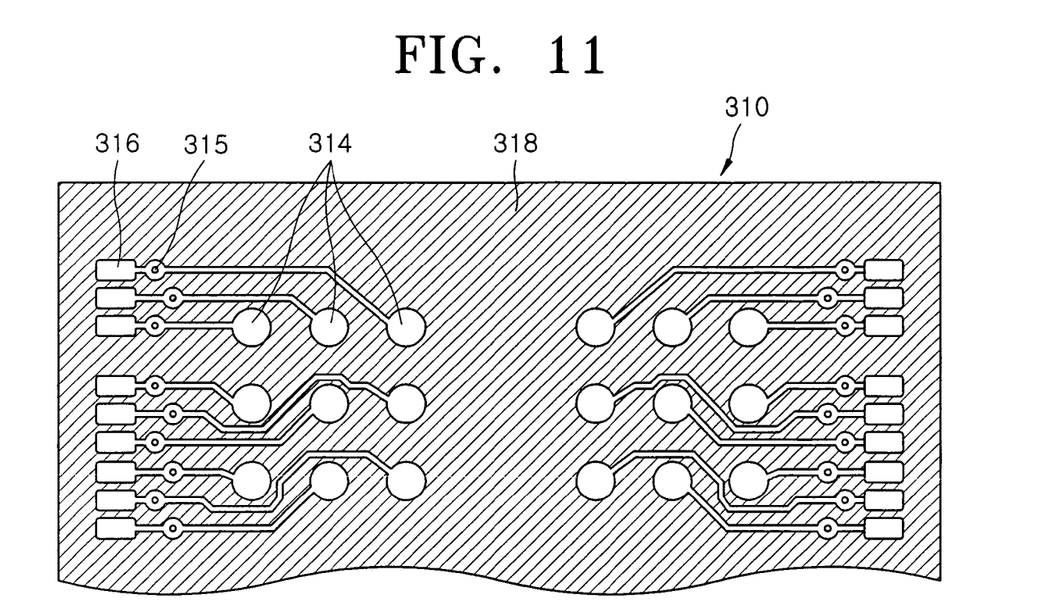
Figure 12:
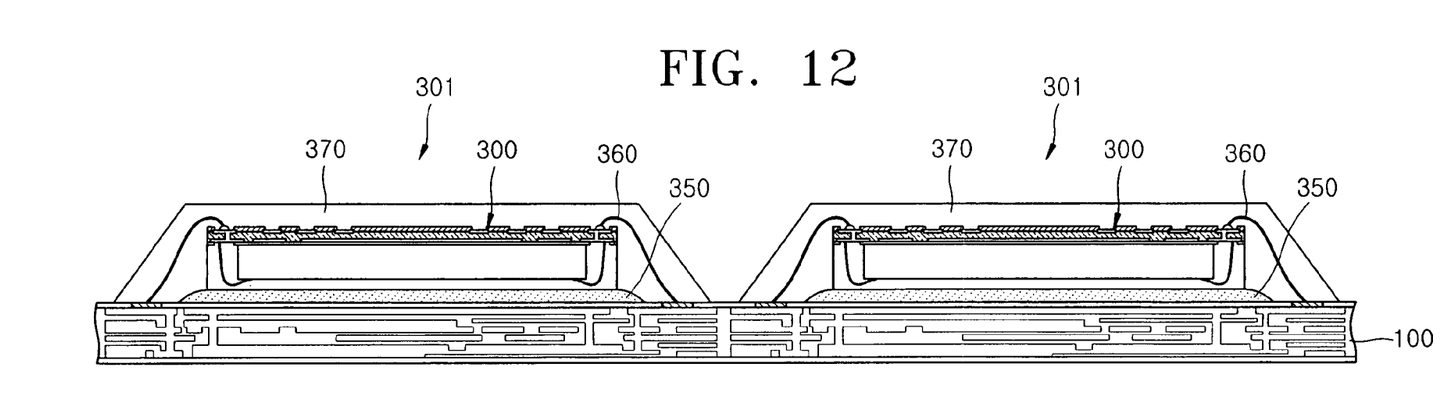

FIGS. 10 through 12 are views illustrating a semiconductor package module according to another embodiment of the present invention.

The embodiment of FIGS. 10 through 12 is similar to the embodiment of FIGS. 4 through 9 except for a structure of a semiconductor package 301. Hence, the same parts as in the embodiment of FIGS. 4 through 9 will not be described to avoid redundancy, instead only different parts will be described.

A semiconductor package 300 includes a substrate 310, which is illustrated in greater detail in the plan view of the substrate shown in FIG. 11. Referring to FIGS. 10 and 11, the substrate 310 has first bond pads 312, which is wire-bonded to bond pads of a semiconductor chip 320, formed on one surface. The first bond pads 312 extend up to a surface of the substrate 310 opposite to the surface on which the first bond pads 312 are formed. Solder ball pads 314 and second bond pads 316 are formed on the surface of the substrate 310 opposite to the surface on which the first bond pads 312 are formed. The first bond pads 312 are electrically connected to the solder ball pads 314 and the second bond pads 316 via through holes 315. In the semiconductor package 300, the substrate 310 has no slits formed in the center because wire bonding occurs on the edges instead of the center. Reference numeral 318 indicates solder resist.

The semiconductor package 300 further includes the semiconductor chip 320, which is attached to the substrate 310 using an adhesive (not shown) so that a circuit surface of the semiconductor chip 320 can contact a surface of the substrate 310 on which the first bond pads 312 are formed. The semiconductor chip 320 includes bond pads formed on the edges. The bond pads formed on the edges of the semiconductor chip 320 are connected to the first bond pads 312 of the substrate 310 by first wires 330. The semiconductor chip 320 and the first wires 330 are enclosed by a first sealing resin 340.

Similar to the semiconductor package 200, the solder ball pads 314 of the semiconductor package 300 are exposed. Hence, the semiconductor package 300 can undergo an electrical final test before being attached to the module board 100. Further, because the second bond pads 316 are exposed, the second bond pads 316 are wire-bonded to the bond pads 116 of the module board 100 using second wires 360 as shown in FIG. 12. A third covering compound 370 then encloses second wires 360 and semiconductor package 300. Similar to the embodiment of FIGS. 4 through 9, the semiconductor package 300 is attached to the module board 100, as via adhesive 350, so that the substrate 310 can face upward and the semiconductor chip 320 under the substrate 310 can contact the upper surface of the module board 100.

Figure 13:
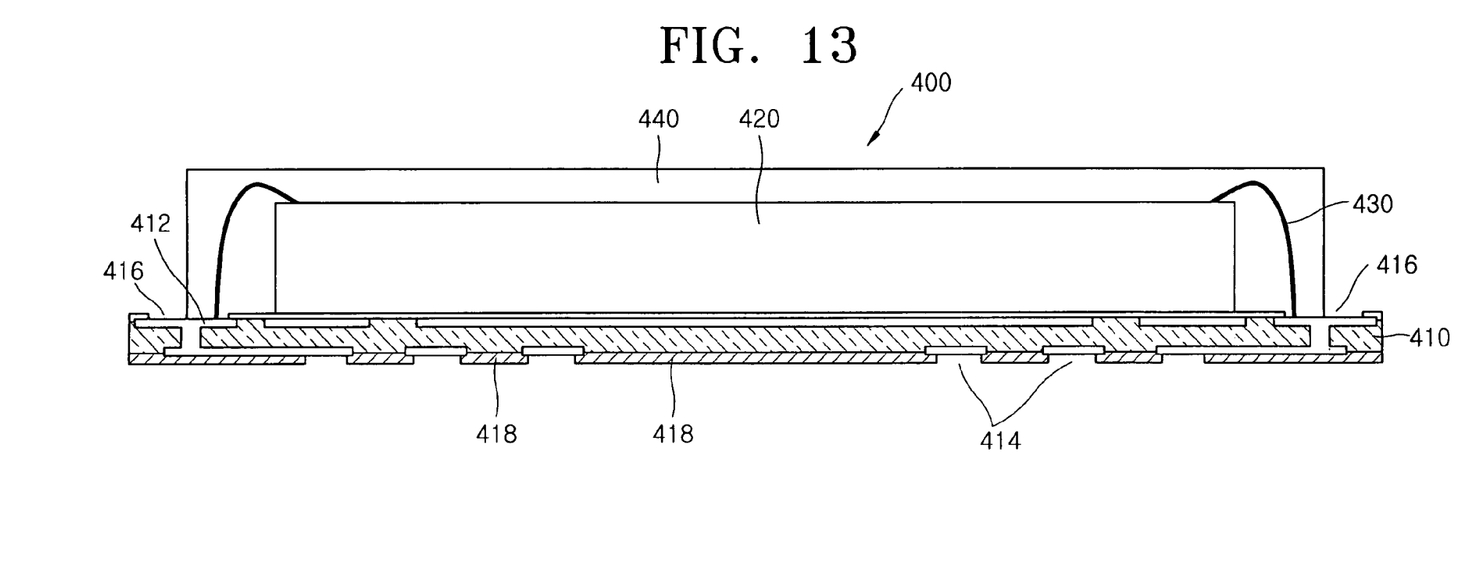
FIGS. 13 through 15 are views for illustrating a semiconductor package module according to yet another embodiment of the present invention.
Figure 14:
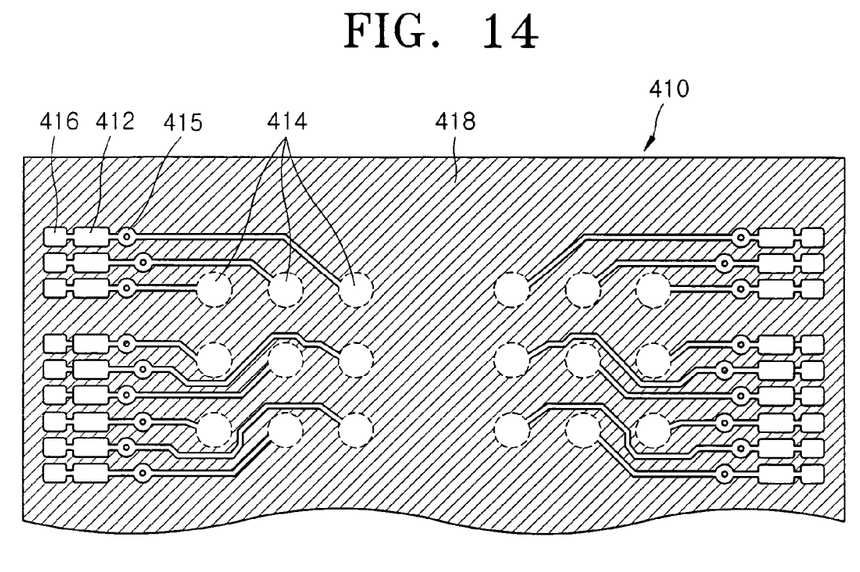
Figure 15:
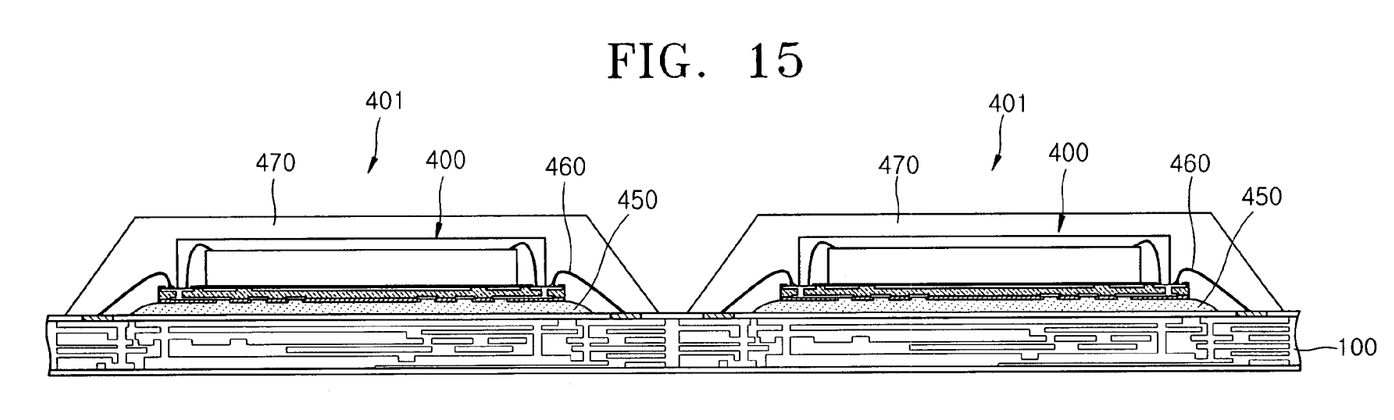

FIGS. 13 through 15 are views for illustrating a semiconductor package module according to another embodiment of the present invention. This embodiment is similar to the embodiment of FIGS. 4 through 9 except for a structure of a semiconductor package 401. Hence, the same parts as in the embodiment of FIGS. 4 through 9 will not be described to avoid redundancy, instead different parts will be described.

A semiconductor package 400 includes a substrate 410, which is illustrated in greater detail in substrate plan view FIG. 14. The substrate 410 has first bond pads 412 formed on one surface, second bond pads 416 connected to the first bond pads 412 and formed on the surface where the first bond pads 412 are formed, and solder ball pads 414 connected to the first and second bond pads 412 and 416 via through holes 415 and formed on a surface of the substrate 410 opposite to the surface where the first and second bond pads 412 and 416 are formed. Reference numeral 418 indicates solder resist.

The semiconductor package 400 further includes a semiconductor chip 420, which is bonded to the substrate 410 using an adhesive (not shown) so that a circuit surface of the semiconductor chip 420 can face upward and the opposite surface can contact the surface of the substrate 410 on which the first bond pads 412 are formed. It is desirable that the semiconductor chip 420 includes bond pads formed on the edges. The bond pads formed on the edges of the semiconductor chip 420 are connected to the first bond pads 412 of the substrate 410 by first wires 430. The semiconductor chip 420, the first wires 430, and the first bond pads 412 are enclosed by a first sealing resin 440. As a result, the second bond pads 416 of the substrate 410 are exposed, and the solder ball pads 414 are also exposed.

In a method of manufacturing the semiconductor package module according to the embodiment of FIGS. 13 through 15, first, the module board 100 is prepared, and the semiconductor package 400 of FIG. 13, which has completed an electrical final test, is prepared. Thereafter, the semiconductor package 400 is attached to the module board 100. The semiconductor package 400 is attached to the module board 100. However, in contrast with the two previous embodiments, the semiconductor package 400 is attached to the module board 100 so that the semiconductor chip 420 can face upward and the substrate 410 under the semiconductor chip 420 can contact the upper surface of the module board 100. Next, second wires 460 connect the second bond pads 416 exposed on the substrate 410 to the bond pads 116 of the module board 100. Finally, the semiconductor package 400 and the second wires 460 are encapsulated using a third sealing resin 470 to thereby complete the semiconductor package 401. Although the third sealing resin 470 encloses the second wires 460 and the entire area of the semiconductor package 400 in FIG. 15, the third sealing resin 470 may enclose the second wires 460 and only a portion of the semiconductor package 400 on which the second wires 460 are formed.

As described above, a semiconductor package module according to the present invention does not use solder balls, thus preventing degradation of solder joint reliability (SJR). Further, the use of a semiconductor package that has already passed an electrical test can prevent degradation of the yield of a completed semiconductor package module.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package module comprising:
a module board having module bond pads;
a pretested semiconductor package bonded to the module board using an adhesive, said semiconductor package having second bond pads;
second wires electrically connecting the second bond pads of the semiconductor package to module bond pads of the module board; and
a third sealing resin sealing the second wires and the semiconductor package, wherein the semiconductor package comprises:
a substrate having a first substrate surface and an opposed surface, said substrate including first bond pads formed on the first substrate surface of the substrate, solder ball pads formed on the first substrate surface and connected to the first bond pads, second bond pads formed on the first substrate surface and connected to the solder ball pads, and a slit adapted to admit wire bonding therethrough formed in a center of the substrate;
a semiconductor chip including a circuit surface, an opposed surface, and lateral sides spanning between the circuit surface and opposed surface, said circuit surface bonded to the substrate using an adhesive, the semiconductor chip having a bond pad formed in a center of the semiconductor chip aligned with the center of the substrate slit;
first wires received through the substrate slit and connecting the bond pad of the semiconductor chip to the first bond pads of the substrate;
a first sealing resin sealing the lateral sides of the semiconductor chip; and
a second sealing resin sealing the first wires and a part of the substrate.

2. The semiconductor package module of claim 1, wherein the semiconductor package is arranged within the semiconductor package module so that the semiconductor chip is interposed between the substrate and the module board.

3. The semiconductor package module of claim 2, wherein the opposed surface of the semiconductor chip faces the module board.

4. The semiconductor package module of claim 1, wherein the locations of the solder ball pads on the substrate are determined according to the Joint Electron Device Engineering Council (JEDEC) international standard.

5. A semiconductor package module comprising:
a module board having module bond pads;
a pretested semiconductor package bonded to the module board using an adhesive, said semiconductor package having second bond pads;
second wires electrically connecting the second bond pads of the semiconductor package to module bond pads of the module board; and
a third sealing resin sealing the second wires and the semiconductor package, wherein the semiconductor package comprises:
a substrate having a first substrate surface and an opposed surface, said substrate including first bond pads formed the first substrate surface, second bond pads formed on the first substrate surface and connected to the first bond pads, and solder ball pads formed on the opposed surface and connected to the first and second bond pads;
a semiconductor chip including a circuit surface and an opposed surface, said opposed surface bonded to the substrate using an adhesive, the semiconductor chip having bond pads formed on the edges of the semiconductor chip;
first wires connecting the bond pads of the semiconductor chip to the first bond pads of the substrate; and
a first sealing resin sealing the semiconductor chip on the substrate, the first wires, and the first bond pads but not the second bond pads.

6. The semiconductor package module of claim 5, wherein the semiconductor package is arranged within the semiconductor package module so that the substrate is interposed between the semiconductor chip and the module board.

7. The semiconductor package module of claim 5, wherein the locations of the solder ball pads on the substrate are determined according to the Joint Electron Device Engineering Council (JEDEC) international standard.

8. A semiconductor package module comprising:
a module board having module bond pads;
a pretested semiconductor package bonded to the module board using an adhesive, said semiconductor package having second bond pads;
second wires electrically connecting the second bond pads of the semiconductor package to module bond pads of the module board; and
a third sealing resin sealing the second wires and the semiconductor package, wherein the second bond pads are exposed so that the semiconductor package can be wire-bonded to the module board via the second bond pads, wherein the pretested semiconductor package further includes a semiconductor chip, and a substrate having the second bond pads, wherein the semiconductor chip is wire-bonded to the second bond pads on a same side of the second bond pads as the second wires.

* * * * *